US011725116B2

(12) United States Patent
Hains et al.

(10) Patent No.: US 11,725,116 B2
(45) Date of Patent: Aug. 15, 2023

(54) CMP COMPOSITION INCLUDING A NOVEL ABRASIVE

(71) Applicant: CMC Materials, Inc., Aurora, IL (US)

(72) Inventors: Alexander W. Hains, Aurora, IL (US); Kim Long, Naperville, IL (US); Steven Grumbine, Aurora, IL (US); Roman A. Ivanov, Aurora, IL (US); Kevin P. Dockery, Aurora, IL (US); Benjamin Petro, St. Charles, IL (US); Brian Sneed, Vernon Hills, IL (US); Galyna Krylova, Naperville, IL (US)

(73) Assignee: CMC MATERIALS, INC., Aurora, IL (US)

( * ) Notice: Subject to any disclaimer, the term of this patent is extended or adjusted under 35 U.S.C. 154(b) by 235 days.

(21) Appl. No.: 17/217,097

(22) Filed: Mar. 30, 2021

(65) Prior Publication Data
US 2021/0301178 A1   Sep. 30, 2021

Related U.S. Application Data

(60) Provisional application No. 63/002,743, filed on Mar. 31, 2020.

(51) Int. Cl.
| | | |
|---|---|---|
| *C09G 1/02* | (2006.01) | |
| *H01L 21/321* | (2006.01) | |
| *C23F 1/26* | (2006.01) | |
| *C23F 11/04* | (2006.01) | |

(52) U.S. Cl.
CPC .............. *C09G 1/02* (2013.01); *C23F 1/26* (2013.01); *C23F 11/04* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 6,293,848 B1* | 9/2001 | Fang | .............. G11B 5/8404 |
| | | | 451/36 |
| 9,127,187 B1 | 9/2015 | Grumbine et al. | |
| 9,303,190 B2 | 4/2016 | Ward et al. | |
| 2018/0066161 A1 | 3/2018 | Tsuchiya et al. | |
| 2019/0085209 A1 | 3/2019 | Dockery et al. | |

FOREIGN PATENT DOCUMENTS

WO   2015138313 A1   9/2015

OTHER PUBLICATIONS

Korean Intellectual Property Office as ISA, Search Report and Written Opinion of the International Searching Authority issued in connection with PCT/US2021/024844 dated Jul. 19, 2021.

* cited by examiner

*Primary Examiner* — Roberts P Culbert

(57) ABSTRACT

A chemical mechanical polishing composition includes a liquid carrier and colloidal silica particles dispersed in the liquid carrier. The colloidal silica particles have a positive charge of at least 10 mV in the liquid carrier and may be characterized as having: (i) a number average aspect ratio of greater than about 1.25 and (ii) a normalized particle size span by weight of greater than about 0.42. The polishing composition may further optionally include an iron-containing accelerator and a tungsten etch inhibitor, for example, when the polishing composition is a tungsten CMP composition.

32 Claims, 3 Drawing Sheets

CMP COMPOSITION INCLUDING A NOVEL ABRASIVE

BACKGROUND OF THE INVENTION

Chemical mechanical polishing (CMP) compositions and methods for polishing (or planarizing) the surface of a substrate are well known. Polishing compositions (also known as polishing slurries, CMP slurries, and CMP compositions) for polishing various metal (such as tungsten) and non-metal (such as silicon oxide) layers on a semiconductor substrate may include abrasive particles suspended in an aqueous solution and various chemical additives such as oxidizers, chelating agents, catalysts, topography control agents, buffers, and the like.

In a conventional CMP operation, the substrate (wafer) to be polished is mounted on a carrier which is in turn mounted on a carrier assembly and positioned in contact with a polishing pad in a CMP polishing tool. The carrier assembly provides a controlled pressure to the substrate against the polishing pad. The substrate and pad are moved relative to one another by an external driving force. The relative motion of the substrate and pad abrades and removes a portion of the material from the surface of the substrate, thereby polishing the substrate. The polishing of the substrate by the relative movement of the pad and the substrate may be further aided by the chemical activity of the polishing composition and/or the mechanical activity of an abrasive suspended in the polishing composition.

In many CMP operations achieving optimum planarization and/or planarization efficiency is of critical importance. For example, in tungsten CMP operations excessive oxide erosion and/or dishing may lead to difficulties in subsequent lithography steps as well as cause electrical contact problems that can degrade electrical performance. Despite many advances to commercial CMP slurries, there remains a need in the industry for CMP slurries (or compositions) such as tungsten CMP slurries that provide for improved planarity during a CMP operation.

Moreover, the semiconductor industry is subject to continuing and sometimes extreme downward pricing pressure. In order to maintain an economically favorable CMP process, high throughput is commonly required thereby necessitating high removal rates and high planarization efficiency. The downward pricing pressure also extends to the CMP consumables themselves (e.g., the slurries and pads). Such pricing pressure poses a challenge to the slurry formulator as the pressure to reduce costs often conflicts with the slurry performance metrics. There is a real need in the industry for CMP slurries (e.g., a tungsten CMP composition) that provides improved planarity at high throughput and reduced costs.

BRIEF SUMMARY OF THE INVENTION

A chemical mechanical polishing composition is disclosed. The composition includes a liquid carrier and colloidal silica particles dispersed in the liquid carrier. The colloidal silica particles have a positive charge of at least 10 mV in the liquid carrier and may be characterized as having: (i) a number average aspect ratio of greater than about 1.25 and (ii) a normalized particle size span by weight of greater than about 0.42. The polishing composition may further optionally include an iron-containing accelerator and a tungsten etch inhibitor (such as polylysine), for example, when the polishing composition is a tungsten CMP composition.

BRIEF DESCRIPTION OF THE DRAWINGS

For a more complete understanding of the disclosed subject matter, and advantages thereof, reference is now made to the following descriptions taken in conjunction with the accompanying drawings, in which.

DETAILED DESCRIPTION OF THE INVENTION

Figure 1A:
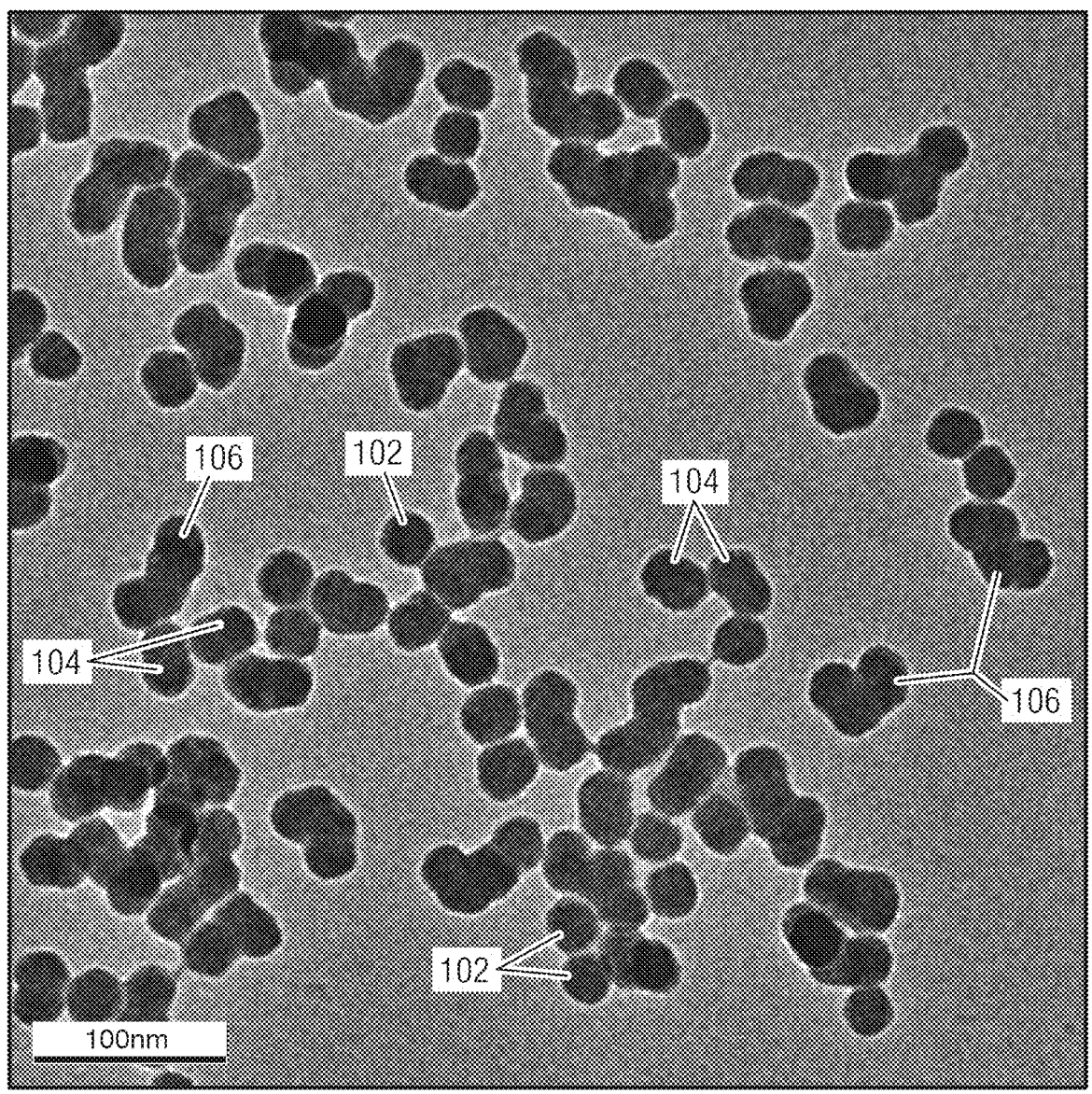
FIG. 1A is a TEM image depicting a partially aggregated colloidal silica.

Chemical mechanical polishing compositions are disclosed. In one embodiment, the composition includes a liquid carrier and colloidal silica particles dispersed in the liquid carrier. The colloidal silica particles have a positive charge of at least 10 mV in the liquid carrier and may be characterized as having: (i) a number average aspect ratio of greater than about 1.25 and (ii) a normalized particle size span by weight of greater than about 0.42. The polishing composition may further optionally include an iron-containing accelerator and an etch inhibitor (such as polylysine) when the polishing composition is a tungsten CMP composition.

In another embodiment, the composition includes a liquid carrier and colloidal silica particles dispersed in the liquid carrier. The colloidal silica particles have a positive charge of at least 10 mV in the liquid carrier and may be characterized as having a normalized particle size span by weight of greater than about 0.42 wherein at least 15% of the colloidal silica particles include three or more aggregated primary particles. The polishing composition may further optionally include an iron-containing accelerator and an etch inhibitor (such as polylysine), for example, when the polishing composition is a tungsten CMP composition.

In yet another embodiment, the composition includes a liquid carrier and colloidal silica particles dispersed in the liquid carrier. The colloidal silica particles include a blend of first colloidal silica particles and second colloidal silica particles dispersed in the liquid carrier. The first colloidal silica particles and the second colloidal silica particles have a positive charge of at least 10 mV in the liquid carrier. The first colloidal silica particles may be characterized as having a number average aspect ratio of greater than about 1.35 while the second colloidal silica particles may be characterized as having a number average aspect ratio of less than 1.15. The polishing composition may further optionally include an iron-containing accelerator and an etch inhibitor (such as polylysine), for example, when the polishing composition is a tungsten CMP composition.

The polishing composition contains colloidal silica particles (abrasive particles) suspended in a liquid carrier. As used herein the term colloidal silica particles refers to silica particles that are prepared via a wet process rather than a pyrogenic or flame hydrolysis process which produces structurally different particles. The colloidal silica may be precipitated or condensation-polymerized silica, which may be prepared using any method known to those of ordinary skill in the art, such as by the sol gel method or by silicate ion-exchange. Condensation-polymerized silica particles are often prepared by condensing $Si(OH)_4$ to form substantially spherical particles.

The colloidal silica particles may be characterized as having a preferred combination of physical properties. For example, in one embodiment, the colloidal silica particles may be characterized as having a number average aspect ratio greater than an aspect ratio threshold and a normalized particle size span by weight of greater than a span threshold. In another embodiment, the colloidal silica particles may be characterized as having a normalized particle size span by weight greater than a span threshold and a particular aggregation distribution (e.g., a percentage of aggregated particles above a threshold).

In one embodiment, the colloidal silica particles may be characterized as having both (i) a number average (median) aspect ratio of greater than about 1.25 and (ii) a normalized particle size span by weight of greater than about 0.42. For example, the number average aspect ratio may be greater than about 1.3 (e.g., greater than about 1.35, greater than about 1.4, or greater than about 1.45) and the normalized particle size span by weight may be greater than about 0.45 (e.g., greater than about 0.5, greater than about 0.55, greater than about 0.6, greater than about 0.65, or greater than about 0.7).

The aspect ratio of a colloidal silica particle is defined herein as the maximum caliper diameter of the particle divided by the minimum caliper diameter of the particle. The number average aspect ratio represents a statistical measure of the average (median) aspect ratio of the colloidal silica particles in the polishing composition (on a number rather than a weight basis). The number average aspect ratio may be referred to as AR50 since statistically half (50%) of the particles have an aspect ratio less than the median value and half (50%) of the particles have an aspect ratio greater than the median value.

The number average aspect ratio of the colloidal silica particles in a polishing composition may be determined by evaluating a large number of particles in high magnification transmission electron microscope (TEM) images (e.g., at a magnification in a range from about 10,000 to about 30,000). To obtain a statistically significant median aspect ratio it is generally necessary to measure and compute the aspect ratio for a large number of colloidal silica particles (e.g., at least 500 or more particles or even 1000 or more particles) using a plurality of images (e.g., at least 10 or more images, 15 or more images, or even 20 or more images). The maximum caliper diameter and the minimum caliper diameter of each of the particles may be measured manually (particle by particle), for example, using the scale bar on the TEM image. However, a user-guided automated process is practically preferred based upon the requirement to evaluate a large number of particles. Such automated processes preferably make use of commercially available image analysis software. One suitable user guided automated process is described in significantly more detail below in Example 1.

The weight-based normalized particle size span of a colloidal silica is defined herein using the following mathematical equation:

$$NSpan = \frac{D90 - D10}{D50}$$

wherein NSpan represents the normalized particle size span of the colloidal silica and D10, D50, and D90 represent CPS particle size decile bins obtained from a weight-averaged particle size distribution (i.e., a distribution in which the particles are counted on a weight basis). The particle size distribution, and thus D10, D50, and D90 are obtained using a CPS Disc Centrifuge Particle size analyzer (e.g., Model DC24000HR) available from CPS Instruments, Prairieville, La. Those of ordinary skill in the art will readily appreciate that the CPS Disc Centrifuge Particle size analyzer includes standard settings for obtaining both weight and number averaged particle size distributions. Those of ordinary skill will further readily appreciate that D50 represents the median particle size. In other words D50 represents the particle size value at which 50 percent of the particles in the sample (counted by weight) are larger and 50 percent are smaller. D10 represents the particle size value at which 90 percent of the particles in the sample (counted by weight) are larger and 10 percent are smaller. And D90 represents the particle size value at which 10 percent of the particles in the sample (counted by weight) are larger and 90 percent are smaller.

The colloidal silica particles in the disclosed embodiments may have substantially any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, La.) or the Zetasizer® available from Malvern Instruments®. The colloidal silica particles may have an average particle size of about 5 nm or more (e.g., about 10 nm or more, or about 20 nm or more). The colloidal silica particles may have an average particle size of about 200 nm or less (e.g., about 180 nm or less or about 160 nm or less). Accordingly, the colloidal silica particles may have an average particle size in a range from about 5 nm to about 200 nm (e.g., from about 10 nm to about 180 nm or from about 20 nm to about 160 nm).

In preferred embodiments, the colloidal silica particles may further have a particle size distribution (as characterized using the CPS Disk Centrifuge particle size analyzer) in which the weight-averaged median particle size (D50 counted by weight) is in a range from about 50 nm to about 150 nm (e.g., in a range from about 60 nm to about 140 nm, from about 70 nm to about 130 nm, from about 75 nm to about 125 nm, or from about 80 nm to about 120 nm. Alternatively and/or additionally, the colloidal silica particles may have a particle size distribution (as characterized using the CPS Disk Centrifuge particle size analyzer) in which the number averaged median particle size (D50 counted by the number of colloidal silica particles) is in a range from about 10 to about 100 nm (e.g., from about 20 nm to about 60 nm, from about 25 nm to about 60 nm, or from about 30 nm to about 50 nm).

In another embodiment, the colloidal silica particles may be characterized as having a normalized particle size span by weight of greater than about 0.42, wherein at least 12 percent of the colloidal silica particles include three or more aggregated primary particles. For example, the normalized particle size span by weight may be greater than about 0.42 (e.g., greater than about 0.45, greater than about 0.5, greater than about 0.55, greater than about 0.6, greater than about 0.65, or greater than about 0.7), wherein at least 15 percent or more of the colloidal silica particles include three or more aggregated primary particles (e.g., 18 percent or more, 20 percent or more, or 25 percent or more). In certain of the aforementioned embodiments, the colloidal silica may be aggregated such that less than 60 percent of the colloidal silica particles are primary particles (e.g., less than 50 percent, or less than 40 percent).

The colloidal silica particles may be both aggregated and non-aggregated (i.e., a portion of the particles may be aggregated and the remainder may be non-aggregated). Non-aggregated particles are individually discrete particles (commonly referred to in the art as primary particles or primaries) that are generally spherical or nearly spherical in shape. Aggregated particles are particles in which multiple primary particles are clustered or bonded together to form aggregates having generally irregular or non-spherical shapes (such as elongated or branched). Non-aggregated (primary) particles may also be referred to herein as monomers. Aggregated particles may also be referred to as dimers (having two primaries), trimers (having three primaries), tetramers (having four primaries), and the like.

Colloidal silica particle aggregation is best evaluated using high magnification scanning electron microscopy (SEM) and/or transmission electron microscopy (TEM) images. Example TEM images showing both aggregated and non-aggregated colloidal silica particles are depicted on FIGS. 1A, 1B, and 1C.

FIG. 1A depicts a partially aggregated colloidal silica. Non-aggregated primary particles are depicted at 102. Aggregated particles including two primaries (dimers) are depicted at 104. And aggregated particles including three or more primaries (trimers, tetramers, etc.) are depicted at 106.

Figure 1B:
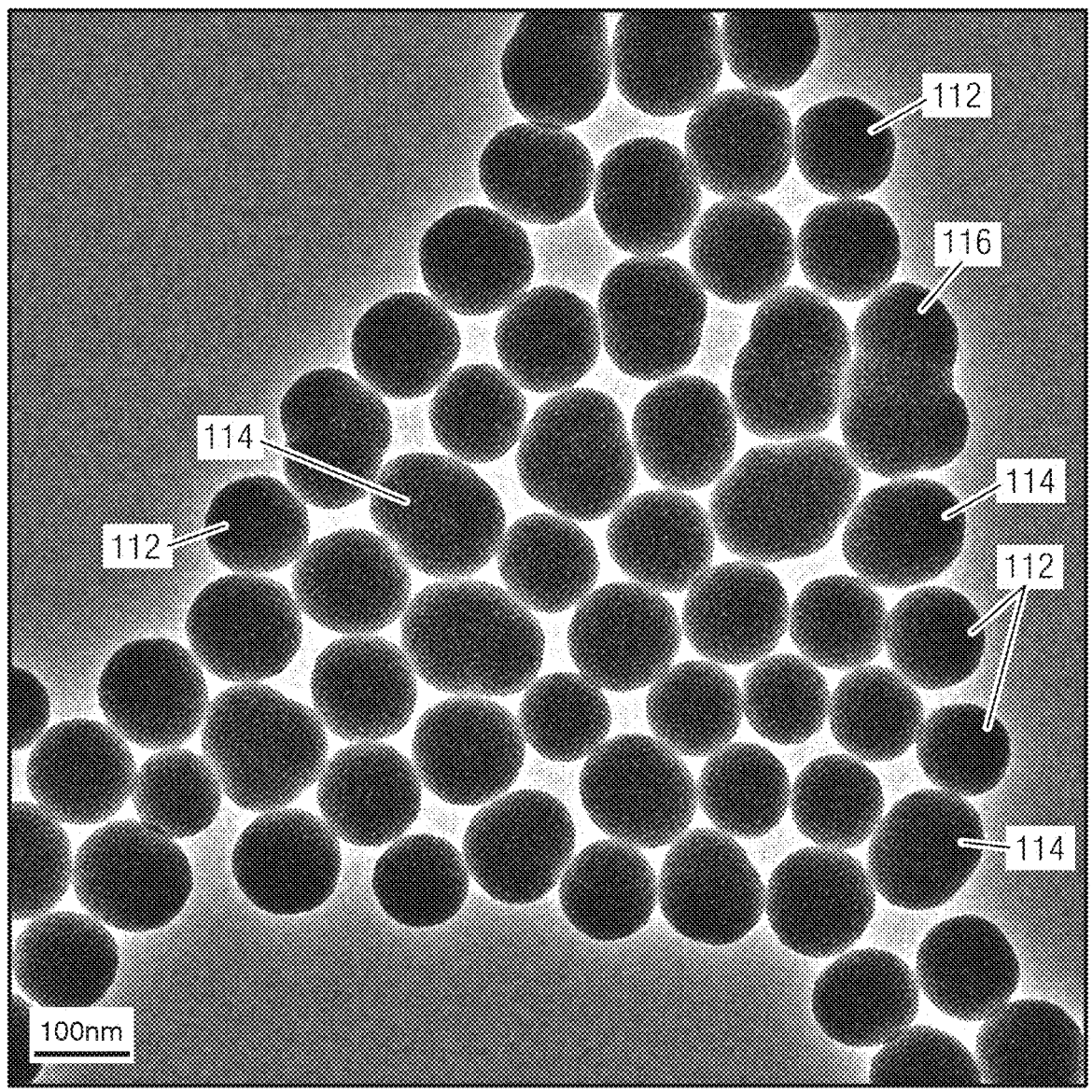
FIG. 1B is a TEM image depicting another partially aggregated colloidal silica.

FIG. 1B depicts another partially aggregated colloidal silica. It is evident that the colloidal silica depicted on FIG. 1B is significantly less aggregated than the colloidal silica depicted on FIG. 1A. It is also evident that the primary particle size of the silica depicted on FIG. 1B is larger than the primary particle size of the colloidal silica depicted on FIG. 1A. Non-aggregated primary particles are depicted at 112. Aggregated particles including two primaries (dimers) are depicted 114. A colloidal silica particle including three primaries (a trimer) is depicted at 116.

Figure 1C:
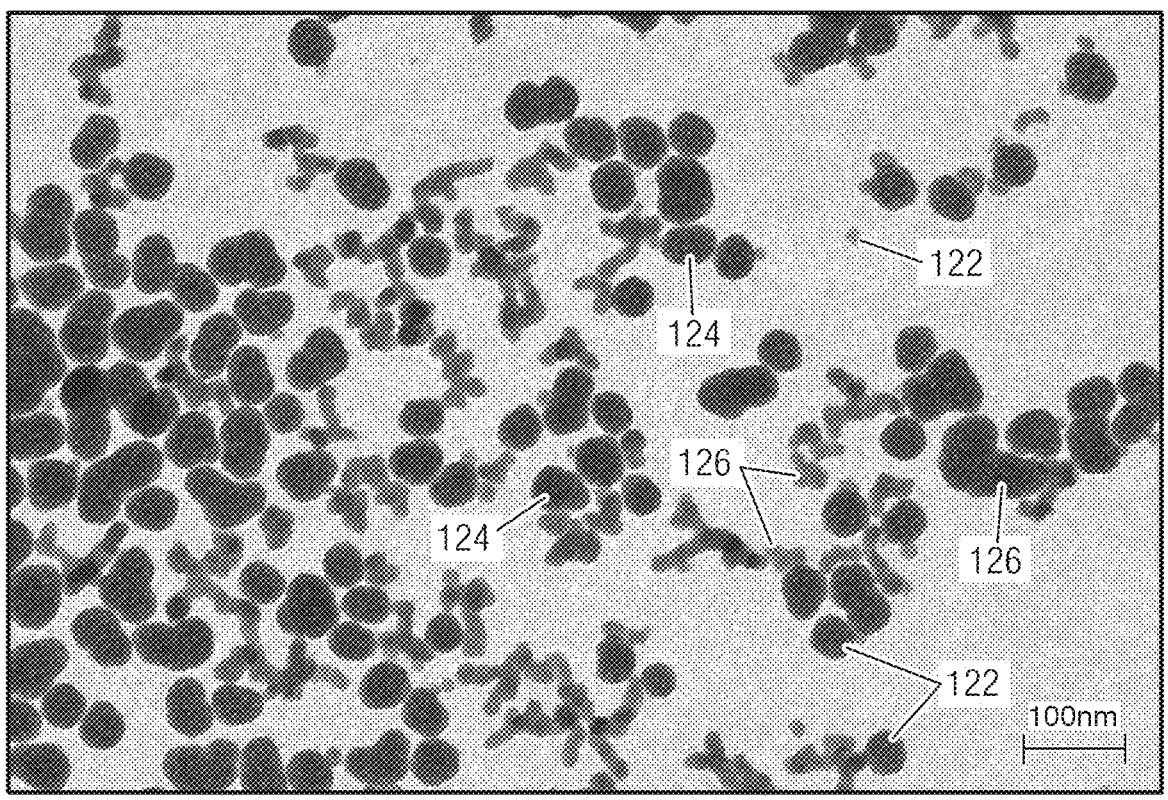
FIG. 1C is a TEM image depicting a colloidal silica prepared by blending first and second distinct colloidal silicas.

FIG. 1C depicts a blend of first and second colloidal silicas. Non-aggregated primary particles are depicted at 122. Aggregated particles including two primaries (dimers) are depicted at 124. And aggregated particles including three or more primaries (trimers, tetramers, etc.) are depicted at 126.

With further reference to the colloidal silicas depicted on FIGS. 1A, 1B, and 1C it is noted that the colloidal silica depicted on FIG. 1A was found to have a number average aspect ratio (AR50) of 1.44 and a normalized particle size span by weight of 0.39. The colloidal silica depicted FIG. 1B was found to have a number average aspect ratio (AR50) of 1.08 and a normalized particle size span by weight of 0.22. The colloidal silica depicted FIG. 1C (i.e., the blend) was found to have a number average aspect ratio (AR50) of 1.36 and a normalized particle size span by weight of 0.44.

It will be appreciated that colloidal silicas having the aforementioned properties may be prepared using substantially any suitable techniques knows to those of skill in the art. For example, the colloidal silica may be formed using a multi-step process in which primary particles are first grown in solution, for example, as described in U.S. Pat. No. 5,230,833. The pH of the solution may then be adjusted to an acidic value for a predetermined time period to promote aggregation (or partial aggregation) of the primary particles, for example, as described in U.S. Pat. No. 8,529,787. An optional final step may allow for further growth of the aggregates (and any remaining primary particles) to obtain colloidal silica particles having the aspect ratio, normalized span, and/or aggregation properties described above.

In alternative embodiments, the colloidal silica may be prepared by blending at least first and second (e.g., first and second, first second, and third, or even first, second, third, and fourth) colloidal silicas at predetermined ratios. For example, in one embodiment, the colloidal silica may be prepared by blending first and second distinct colloidal silicas in which the first colloidal silica has a number average aspect ratio of greater than 1.30 (e.g., greater than about 1.35 or greater than about 1.4) and the second colloidal silica has a number average aspect ratio of less than 1.2 (e.g., less than about 1.15 or less than about 1.1). In such embodiments, each of the first and second colloidal silicas may further have a normalized particle size span by weight of less than about 0.42. For example, the first colloidal silica may have a normalized particle size span by weight of less than about 0.42 and the second colloidal silica may have a normalized particle size span by weight of less than about 0.3

In still other embodiments obtained by blending at least first and second distinct colloidal silicas, at least 20 percent (e.g., at least 25 percent or at least 30 percent) of the first colloidal silica particles may include three or more aggregated primary particles and at least 50 percent (e.g., at least 60 percent, at least 70 percent, or at least 80 percent) of the second colloidal silica particles may be monomers or dimers. The colloidal silica depicted on FIG. 1C is an example of one such embodiment obtained by blending first and second distinct colloidal silicas (blending compositions 1C and 1E to obtain composition 1U as described in more detail below in Example 1).

It will be appreciated that the first and second (or first, second, and third, etc.) colloidal silicas may be blended at substantially any suitable ratio(s) to obtain the desired aspect ratio, normalized span, and/or aggregation properties recited above. For example, in embodiments including a blend of first and second colloidal silicas, the first colloidal silica particles and the second colloidal silica particles may be blended in a weight ratio ranging from about 1:15 to about 15:1 (e.g., from about 1:15 to about 1:1, from about 1:1 to about 15:1, from about 1:10 to about 10:1, or from about 1:5 to about 5:1).

In embodiments including a blend of first and second colloidal silicas (or first, second, and third, etc.), the blended colloidal silicas may include substantially any suitable commercially available colloidal silicas. Those of ordinary skill in the art will readily appreciate that colloidal silicas having a wide range of physical properties are commercially available from a large number of vendors, for example, including Nissan Chemical Industries, Ltd., Nalco Holding Company, W.R. Grace and Company, Fuso Chemical Company, Nouryon, Nyacol Nano Technologies, Inc., Tama Chemicals Company, and JGC Holdings Corporation.

The polishing composition may include substantially any suitable amount of the above described colloidal silica particles. For example, the polishing composition may include about 0.01 wt. % or more colloidal silica particles at point of use (e.g., about 0.05 wt. % or more, about 0.1 wt. % or more, about 0.2 wt. % or more, about 0.3 wt. % or more, about 0.4 wt. % or more, or about 0.5 wt. % or more). The amount of colloidal silica particles in the polishing composition may include about 20 wt. % or less at point of use (e.g., about 20 wt. % or less, about 5 wt. % or less, or about 3 wt. % or less, about 2 wt. % or less, or even about 1 wt. % or less). Accordingly, it will be understood that the amount of colloidal silica particles may be in a range bounded by any two of the aforementioned endpoints, for example, in a range from about 0.01 wt. % to about 20 wt. % at point of use (e.g., from about 0.1 wt. % to about 10 wt. %, from about 0.1 wt. % to about 5 wt. %, from about 0.1 wt. % to about 3 wt. %, or from about 0.2 wt. % to about 3 wt. %).

A liquid carrier is generally used to facilitate the application of the abrasive (the colloidal silica particles) and any optional chemical additives to the surface of the substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The colloidal silica particles preferably have a positive charge in the polishing composition (e.g., in the liquid carrier). The charge on colloidal silica particles is commonly referred to in the art as the zeta potential (or the electrokinetic potential). As known to those of ordinary skill in the art, the zeta potential of a particle refers to the electrical potential difference between the electrical charge of the ions surrounding the particle and the electrical charge of the bulk solution of the polishing composition (e.g., the liquid carrier and any other components dissolved therein). The zeta potential may be obtained using commercially available instrumentation such as the Zetasizer available from Malvern Instruments, the ZetaPlus Zeta Potential Analyzer available from Brookhaven Instruments, and/or an electroacoustic spectrometer available from Dispersion Technologies, Inc.

The colloidal silica particles preferably have a positive charge in the polishing composition of about 10 mV or more (e.g., about 15 mV or more, about 20 mV or more, or about 25 mV or more). The colloidal silica particles preferably have a positive charge in the polishing composition of about 60 mV or less (e.g., about 55 mV or less or about 50 mV or less). Accordingly, it will be understood that the colloidal silica particles may have a positive charge in the polishing composition in a range bounded by any one of the aforementioned endpoints, for example, in a range from about 10 mV to about 60 mV (e.g., about 15 mV to about 60 mV, or about 25 mV to about 50 mV).

While the disclosed embodiments are not limited in this regard, the colloidal silica particles may advantageously have a permanent positive charge. By permanent positive charge it is meant that the positive charge on the silica particles is not readily reversible, for example, via flushing, dilution, filtration, and the like. A permanent positive charge may be the result, for example, of covalently bonding a cationic compound with the colloidal silica. A permanent positive charge is in contrast to a reversible positive charge that may be the result, for example, of an electrostatic interaction between a cationic compound and the colloidal silica. Notwithstanding, as used herein, a permanent positive charge of at least 10 mV means that the zeta potential of the colloidal silica particles remains above 10 mV after the three step ultrafiltration test described in further detail in commonly assigned U.S. Pat. No. 9,238,754.

Colloidal silica particles having a permanent positive charge in the polishing composition may be obtained, for example, via treating the particles with at least one aminosilane compound as disclosed in commonly assigned U.S. Pat. Nos. 7,994,057 and 9,028,572. Alternatively, colloidal silica particles having a permanent positive charge in the polishing composition may be obtained by incorporating a chemical species, such as an aminosilane compound, in the colloidal silica particles as disclosed in in commonly assigned U.S. Pat. No. 9,422,456.

The colloidal silica particles may alternatively have a non-permanent positive charge imparted thereto, for example, via contact with a cation-containing component (i.e., a positively charged species) in the liquid carrier. A non-permanent positive charge may be achieved, for example, via treating the particles with at least one cation-containing component, for example, selected from ammonium salts (preferably quaternary amine compounds), phosphonium salts, sulfonium salts, imidazolium salts, and pyridinium salts.

The polishing composition may have substantially any suitable pH depending on the intended application. In other words, the polishing composition may be acidic, neutral, or alkaline. In part to minimize safety and shipping concerns, the pH is generally in a range from about 2 to about 12 (e.g., from about 2 to about 6, from about 5 to about 9, or from about 8 to about 12). In embodiments, in which the polishing composition is intended for polishing tungsten metal (a W CMP composition), the pH is preferably acidic, and is therefore less than about 7. In such embodiments, the pH is preferably about 1 or more (e.g., about 1.5 or more, or about 2 or more) and about 6 or less (e.g., about 5 or less, or about 4 or less). Accordingly, the pH of a disclosed W CMP composition is preferably in a range from about 1 to about 6 (e.g., from about 1 to about 5, from about 2 to about 5, or from about 2 to about 4).

The pH of the polishing composition may be achieved and/or maintained by any suitable means. The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, and the like while suitable buffering agents may include phosphates, sulfates, acetates, malonates, oxalates, borates, ammonium salts, and the like.

Disclosed polishing compositions may include substantially any suitable chemical additives. Polishing compositions configured for polishing a metal layer may include, for example, one or more of the following components: an oxidizing agent, a chelating agent, a polishing rate accelerating agent, a catalyst, a polishing rate inhibitor, a topography control agent, an etch inhibitor, pH buffering agents, dispersants, and biocides. Polishing compositions configured for polishing a dielectric layer may include, for example, one or more of the following components: cationic, anionic, or nonionic polymers, secondary polishing rate accelerators or inhibitors (e.g., for nitride layers), dispersants, conditioners, scale inhibitors, chelating agents, stabilizers, pH buffering agents, and biocides. Such additives are purely optional. The disclosed embodiments are not so limited and do not require the use of any one or more of such additives.

Certain disclosed polishing composition embodiments may be configured for polishing tungsten metal (e.g., in a tungsten CMP operation). Such tungsten CMP compositions may optionally further include an iron-containing accelerator, a stabilizer, and/or an oxidizer. An iron-containing accelerator as used herein is an iron-containing chemical compound that increases the removal rate of tungsten during a tungsten CMP operation. For example, the iron-containing accelerator may include a soluble iron-containing catalyst such as is disclosed in U.S. Pat. Nos. 5,958,288 and 5,980,775. Such an iron-containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, carboxylic acids, acetylacetonates, citrates, gluconates, malonates, oxalates, phthalates, and succinates, and mixtures thereof.

An iron-containing accelerator may also include an iron-containing activator (e.g., a free radical producing compound) or an iron-containing catalyst associated with (e.g., coated or bonded to) the surface of the colloidal silica particle such as is disclosed in U.S. Pat. Nos. 7,029,508 and 7,077,880. For example, the iron-containing accelerator may be bonded with the silanol groups on the surface of the colloidal surface particles.

The amount of iron-containing accelerator in the polishing composition may be varied depending upon the oxidizing agent used and the chemical form of the accelerator. When the oxidizing agent is hydrogen peroxide (or one of its analogs) and a soluble iron-containing catalyst is used (such as ferric nitrate or hydrates of ferric nitrate), the catalyst may be present in the composition at point of use in an amount sufficient to provide a range from about 0.5 to about 3000 ppm Fe based on the total weight of the composition. The polishing composition may include about 1 ppm Fe or more at point of use (e.g., about 2 ppm or more, about 5 ppm or more, or about 10 ppm or more). The polishing composition may include about 1000 ppm Fe or less at point of use (e.g., about 500 ppm or less, about 200 ppm or less, or about 100 ppm or less). The polishing composition may thus include Fe in a range bounded by any one of the above endpoints. The composition may include from about 1 to about 1000 ppm Fe at point of use (e.g., from about 2 to about 500 ppm, from about 5 to about 200 ppm, or from about 10 to about 100 ppm).

Embodiments of the polishing composition including an iron-containing accelerator may further include a stabilizer. Without such a stabilizer, the iron-containing accelerator and the oxidizing agent, if present, may react in a manner that degrades the oxidizing agent rapidly over time. The addition of a stabilizer tends to reduce the effectiveness of the iron-containing accelerator such that the choice of the type and amount of stabilizer added to the polishing composition may have a significant impact on CMP performance. The addition of a stabilizer may lead to the formation of a stabilizer/accelerator complex that inhibits the accelerator from reacting with the oxidizing agent, if present, while at the same time allowing the accelerator to remain sufficiently active so as to promote rapid tungsten polishing rates.

Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. The term "acid" as it is used herein to describe useful stabilizers also means the conjugate base of the acid stabilizer. Stabilizers can be used alone or in combination and significantly reduce the rate at which oxidizing agents such as hydrogen peroxide decompose.

Preferred stabilizers include phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. The preferred stabilizers may be added to the compositions of this invention in an amount ranging from about 1 equivalent per iron-containing accelerator to about 3.0 weight percent or more (e.g., from about 3 to about 10 equivalents). As used herein, the term "equivalent per iron-containing accelerator" means one molecule of stabilizer per iron ion in the composition. For example 2 equivalents per iron-containing accelerator means two molecules of stabilizer for each catalyst ion.

The polishing composition may optionally further include an oxidizing agent. The oxidizing agent may be added to the polishing composition during the slurry manufacturing process or just prior to the CMP operation (e.g., in a tank located at the semiconductor fabrication facility). Preferable oxidizing agents include inorganic or organic per-compounds. A per-compound as defined herein is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($S_2O_8^=$), and sodium peroxide. Examples of compounds containing an element in its highest oxidation state include but are not limited to periodic acid, periodate salts, perbromic acid, perbromate salts, perchloric acid, perchlorate salts, perboric acid, and perborate salts and permanganates. The most preferred oxidizing agent is hydrogen peroxide.

The oxidizing agent may be present in the polishing composition in an amount ranging, for example, from about 0.1 to about 20 wt. % at point of use. For example, in embodiments in which a hydrogen peroxide oxidizer and a soluble iron-containing accelerator are used, the oxidizer may be present in the polishing composition in an amount ranging from about 0.1 wt. % to about 10 wt. % at point of use (e.g., from about 1 wt. % to about 10 wt. %, from about 1 wt. % to about 5 wt. %).

Example polishing compositions configured for polishing tungsten metal may optionally further include a compound that inhibits tungsten etching. Suitable inhibitor compounds inhibit the conversion of solid tungsten into soluble tungsten compounds while at the same time allowing for effective removal of solid tungsten via the CMP operation. The polishing composition may include substantially any suitable inhibitor, for example, inhibitor compounds disclosed in commonly assigned U.S. Pat. Nos. 9,238,754; 9,303,188; and 9,303,189.

Example classes of compounds that that are useful inhibitors of tungsten etching include compounds having nitrogen containing functional groups such as nitrogen containing heteroycles, alkyl ammonium ions, amino alkyls, and amino acids. Useful amino alkyl corrosion inhibitors include, for example, hexylamine, tetramethyl-p-phenylene diamine, octylamine, diethylene triamine, dibutyl benzylamine, aminopropylsilanol, aminopropylsiloxane, dodecylamine, mixtures thereof, and synthetic and naturally occurring amino acids including, for example, lysine, tyrosine, glutamine, glutamic acid, cystine, and glycine (aminoacetic acid).

The inhibitor compound may alternatively and/or additionally include an amine compound in solution in the liquid carrier. The amine compound (or compounds) may include a primary amine, a secondary amine, a tertiary amine, or a quaternary amine. The amine compound may further include a monoamine, a diamine, a triamine, a tetramine, or an amine based polymer having a large number of repeating amine groups (e.g., 4 or more amine groups).

Suitable inhibitor compounds may further include a cationic polymer. Example cationic polymers include but are not limited to poly(vinylimidazolium), poly(methacryloyloxyethyltrimethylammonium) chloride (polyMADQUAT), poly(diallyldimethylammonium) chloride (polyDADMAC) (i.e., Polyquaternium-6), poly(dimethylamine-co-epichlorohydrin), poly [bis(2-chloroethyl) ether-alt-1,3-bis[3-(dimethylamino)propyl]urea] (i.e., Polyquaternium-2), copolymers of hydroxyethyl cellulose and diallyldimethylammonium (i.e., Polyquaternium-4), copolymers of acrylamide and diallyldimethylammonium (i.e., Polyquaternium-7), quaternized hydroxyethylcellulose ethoxylate (i.e., Polyquaternium-10), copolymers of vinylpyrrolidone and quaternized dimethylaminoethyl methacrylate (i.e., Polyquatemium-11), copolymers of vinylpyrrolidone and quaternized vinylimidazole (i.e., Polyquatemium-16), Polyquaternium-24, a terpolymer of vinylcaprolactam, vinylpyrrolidone, and quaternized vinylimidazole (i.e., Polyquaternium-46), 3-Methyl-1-vinylimidazolium methyl sulfate-N-vinylpyrrolidone copolymer (i.e., Polyquaternium-44), and copolymers of vinylpyrrolidone and diallyldimethylammonium. Additionally, suitable cationic polymers include cationic polymers for personal care such as Luviquat® Supreme, Luviquat® Hold, Luviquat® UltraCare, Luviquat® FC 370, Luviquat® FC 550, Luviquat® FC 552, Luviquat® Excellence, GOHSEFIMER K210™, GOHSENX K-434, and combinations thereof.

In certain advantageous embodiments, the tungsten inhibitor compound may include a cationic polymer having an amino acid monomer (such compounds may also be referred to as polyamino acid compounds). Suitable polyamino acid compounds may include substantially any suitable amino acid monomer groups, for example, including polyarginine, polyhistidine, polyalanine, polyglycine, polytyrosine, polyproline, and polylysine. In certain embodiments, polylysine is a preferred polyamino acid. It will be understood that polylysine may include ε-polylysine and/or α-polylysine composed of D-lysine and/or L-lysine. The polylysine may thus include α-poly-L-lysine, α-poly-D-lysine, ε-poly-L-lysine, ε-poly-D-lysine, and mixtures thereof. In a preferred embodiment, the tungsten inhibitor includes polylysine and most preferably ε-poly-L-lysine. It will further be understood that the polyamino acid compound (or compounds) may be used in any accessible form, e.g., the conjugate acid or base and salt forms of the polyamino acid may be used instead of (or in addition to) the polyamino acid.

Disclosed polishing compositions for polishing tungsten metal may include substantially any suitable concentration of the inhibitor compound. In general the concentration is desirably high enough to provide adequate etch inhibition, but low enough so that the compound is soluble and so as not to reduce tungsten polishing rates below acceptable levels. By soluble it is meant that the compound is fully dissolved in the liquid carrier or that it forms micelles in the liquid carrier or is carried in micelles. It may be necessary to vary the concentration of the inhibitor compound depending upon numerous various factors, for example, including the solubility thereof, the number of amine groups therein, the length of an alkyl group, the relationship between etch rate inhibition and polishing rate inhibition, the oxidizing agent used, the concentration of the oxidizing agent, and so on. In certain desirable embodiments, the concentration of an amine compound in the polishing composition may be in a range from about 0.1 µM to about 10 mM at point of use (i.e., from about $10^{-7}$ to about $10^{-2}$ molar). For example, in embodiments utilizing a polymeric inhibitor such as a cationic polymer, the concentration may be on the lower end of the range (e.g., from about $10^{-7}$ to about $10^{-4}$ molar at point of use). In other embodiments utilizing a non-polymeric compound, (having fewer cationic groups and a lower molecular weight), the concentration may be on the higher end of the range (e.g., from about $10^{-5}$ to about $10^{-2}$ molar at point of use).

The polishing composition may optionally further include a biocide. The biocide may include any suitable biocide, for example an isothiazolinone biocide. The amount of biocide in the polishing composition typically is in a range from about 1 ppm to about 50 ppm at point of use or in a concentrate, and preferably from about 1 ppm to about 20 ppm.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the colloidal silica, the iron-containing accelerator, the amine compound, etc.).

For example, the polishing composition components (such as an iron-containing accelerator, a stabilizer, an etch inhibitor, and/or a biocide) may be added directly to a colloidal silica having the above described physical properties (e.g., the specified aspect ratio, normalized span, and positive charge). In an alternative example, first and second colloidal silicas may optionally be treated, for example, with an aminosilane compound, so as to produce corresponding colloidal silicas having a positive charge. The first and second colloidal silicas may be mixed together prior to adding the other polishing composition components. Alternatively, the other components may be added to one of the colloidal silicas prior to mixing the first and second colloidal silicas together. The colloidal silica(s) and the other components may be blended together using any suitable techniques for achieving adequate mixing. Such blending/mixing techniques are well known to those of ordinary skill in the art. An optional oxidizing agent may be added at any time during the preparation of the polishing composition. For example, the polishing composition may be prepared prior to use, with one or more components, such as the oxidizing agent, being added just prior to the CMP operation (e.g., within about 1 minute, or within about 10 minutes, or within about 1 hour, or within about 1 day, or within about 1 week of the CMP operation). The polishing composition also may also be prepared by mixing the components at the surface of the substrate (e.g., on the polishing pad) during the CMP operation.

The polishing composition may advantageously be supplied as a one-package system comprising a colloidal silica having the above described physical properties and other optional components. An oxidizing agent may be desirably supplied separately from the other components of the polishing composition and may be combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Various other two-container, or three- or more-container, combinations of the components of the polishing composition are within the knowledge of one of ordinary skill in the art.

The polishing composition of the invention may also be provided as a concentrate which is intended to be diluted with an appropriate amount of water prior to use. In such an embodiment, the polishing composition concentrate may include the colloidal silica, water, and other optional components such as an iron-containing accelerator, a stabilizer, an etch inhibitor, and a biocide, with or without the oxidizing agent, in amounts such that, upon dilution of the concentrate with an appropriate amount of water, and an optional oxidizing agent if not already present in an appropriate amount, each component of the polishing composition will be present in the polishing composition in an amount within the appropriate ranges recited above for each component. For example, the colloidal silica and other optional components may each be present in the polishing composition in an amount that is about 2 times (e.g., about 3 times, about 4 times, about 5 times, or even about 10 times) greater than the point of use concentrations recited above for each component so that, when the concentrate is diluted with an equal volume of (e.g., 2 equal volumes of water, 3 equal volumes of water, 4 equal volumes of water, or even 9 equal volumes of water respectively), along with the oxidizing agent in a suitable amount, each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

The disclosed polishing compositions may be used to polish substantially any substrate, for example, including a silicon nitride layer, a silicon oxide layer, and/or a metal layer such as a tungsten layer, a copper layer, an aluminum layer, a cobalt layer, and/or a barrier layer such as a titanium layer, a titanium nitride layer, a tantalum layer, and/or a tantalum nitride layer. Certain advantageous embodiments may be particularly useful in the polishing of a substrate including at least one metal including tungsten and at least one dielectric material such as silicon oxide. In such applications, the tungsten layer may be deposited over one or more barrier layers, for example, including titanium and/or titanium nitride (TiN). The dielectric layer may be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as tungsten, titanium, titanium nitride, and/or a dielectric material as described herein) to polish the substrate.

In certain desirable embodiments, the disclosed polishing composition enables high tungsten removal rates and high planarization efficiency to be achieved for a substrate having a tungsten metal layer and a dielectric layer. For example, in certain advantageous embodiments tungsten removal rates greater than 3000 Å/min may be achieved (e.g., greater than 3500 Å/min, greater than 4000 Å/min, greater than 4500 Å/min, or greater than 5000 Å/min). In such embodiments, array erosion and/or tungsten line dishing on a 1×1 μm array of less than 250 Å to be achieved (e.g., less than 200 Å, less than 150 Å, less than 100 Å, or even less than 50 Å).

A substrate may be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

It will be understood that the disclosure includes numerous embodiments. These embodiments include, but are not limited to, the following embodiments.

In a first embodiment a chemical mechanical polishing composition may comprise, consist of, or consist essentially of a liquid carrier; colloidal silica particles dispersed in the liquid carrier, the colloidal silica particles having a positive charge of at least 10 mV in the liquid carrier; and an iron-containing accelerator; a metal etch inhibitor; wherein the colloidal silica particles have (i) a number average aspect ratio of greater than about 1.25 and (ii) a normalized particle size span by weight of greater than about 0.42.

A second embodiment may include the first embodiment wherein the colloidal silica particles have a number average aspect ratio of greater than about 1.35.

A third embodiment may include any one of the first through second embodiments wherein the colloidal silica particles have a normalized particle size span by weight of greater than about 0.6.

A fourth embodiment may include the first embodiment wherein the colloidal silica particles have (i) a number average aspect ratio of greater than about 1.35 and a normalized particle size span by weight of greater than about 0.6.

A fifth embodiment may include any one of the first through fourth embodiments wherein the colloidal silica particles have a particle size distribution by number in which D50 is in a range from about 20 nm to about 60 nm.

A sixth embodiment may include any one of the first through fifth embodiments wherein the colloidal silica particles have a particle size distribution by weight in which D50 is in a range from about 60 nm to about 140 nm.

A seventh embodiment may include any one of the first through sixth embodiments wherein: the colloidal silica particles comprise a blend of first colloidal silica particles and second colloidal silica particles; the first colloidal silica particles having a number average aspect ratio of greater than about 1.35; and the second colloidal silica particles having a number average aspect ratio of less than about 1.15.

A eighth embodiment may include the seventh embodiment wherein the first colloidal silica particles and the second colloidal silica particles are blended in a weight ratio ranging from about 1:15 to about 1:1.

A ninth embodiment may include any one of the seventh through eighth embodiments wherein: the first colloidal silica particles have a normalized particle size span by weight of less than about 0.42; and the second colloidal silica particles have a normalized particle size span by weight of less than about 0.42.

A tenth embodiment may include any one of the first through ninth embodiments wherein the colloidal silica particles have a permanent positive charge of at least 10 mV.

An eleventh embodiment may include any one of the first through tenth embodiments wherein the iron-containing accelerator comprises a soluble iron-containing catalyst and the composition further comprises a stabilizer bound to the soluble iron-containing catalyst, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

A twelfth embodiment may include any one of the first through eleventh embodiments further comprising a hydrogen peroxide oxidizer.

A thirteenth embodiment may include any one of the first through twelfth embodiments having a pH in a range from about 1.0 to about 5.0.

A fourteenth embodiment may include any one of the first through thirteenth embodiments wherein the metal etch inhibitor is polylysine.

In a fifteenth embodiment a chemical mechanical polishing composition may comprise, consist of, or consist essentially of a liquid carrier; colloidal silica particles dispersed in the liquid carrier, the colloidal silica particles having a positive charge of at least 10 mV in the liquid carrier; an iron-containing accelerator; and a metal etch inhibitor; wherein the colloidal silica particles have a normalized particle size span of greater than about 0.42 and wherein at least 15% of the colloidal silica particles include three or more aggregated primaries.

A sixteenth embodiment may include the fifteenth embodiment wherein the colloidal silica particles have a normalized particle size span of greater than about 0.6.

A seventeenth embodiment may include any one of the fifteenth through sixteenth embodiments wherein less than 50% of the colloidal silica particles are monomers.

An eighteenth embodiment may include any one of the fifteenth through seventeenth embodiments wherein: the colloidal silica particles have a normalized particle size span of greater than about 0.6 and less than 50% of the colloidal silica particles are monomers.

A nineteenth embodiment may include any one of the fifteenth through eighteenth embodiments wherein the colloidal silica particles have a number average aspect ratio of greater than about 1.25.

A twentieth embodiment may include any one of the fifteenth through nineteenth embodiments wherein: the colloidal silica particles comprise a blend of first colloidal silica particles and second colloidal silica particles; at least 20% of the first colloidal silica particles include three or more aggregated primaries; and at least 50% of the second colloidal silica particles are monomers or dimers.

A twenty-first embodiment may include any the twentieth embodiment wherein the first colloidal silica particles and the second colloidal silica particles are blended in a weight ratio ranging from about 1:15 to about 1:1.

A twenty-second embodiment may include any one of the fifteenth through twenty-first embodiments wherein the colloidal silica particles have a permanent positive charge of at least 10 mV.

A twenty-third embodiment may include any one of the fifteenth through twenty-second embodiments wherein the iron-containing accelerator comprises a soluble iron-containing catalyst and the composition further comprises a stabilizer bound to the soluble iron-containing catalyst, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

A twenty-fourth embodiment may include any one of the fifteenth through twenty-third embodiments further comprising a hydrogen peroxide oxidizer.

A twenty-fifth embodiment may include any one of the fifteenth through twenty-fourth embodiments having a pH in a range from about 1.0 to about 5.0.

A twenty-sixth embodiment may include any one of the fifteenth through twenty-fifth embodiments wherein the metal etch inhibitor is polylysine.

In a twenty-seventh embodiment a chemical mechanical polishing composition may comprise, consist of, or consist essentially of a liquid carrier; first colloidal silica particles dispersed in the liquid carrier, the first colloidal silica particles having (i) a positive charge of at least 10 mV in the liquid carrier and (ii) a number average aspect ratio of greater than 1.35; second colloidal silica particles dispersed in the liquid carrier, the second colloidal silica particles having (i) a positive charge of at least 10 mV in the liquid carrier and (ii) a number average aspect ratio of less than 1.15; an iron-containing accelerator; and a polyamino acid tungsten etch inhibitor.

A twenty-eighth embodiment may include the twenty-seventh embodiment wherein each of the first and second colloidal silica particles have a normalized particle size span of less than about 0.42.

A twenty-ninth embodiment may include any one of the twenty-seventh through twenty-eighth embodiments wherein: at least 20% of the first colloidal silica particles include three or more aggregated primaries; and at least 50% of the second colloidal silica particles are monomers or dimers.

A thirtieth embodiment may include any one of the twenty-seventh through twenty-ninth embodiments wherein the first colloidal silica particles and the second colloidal silica particles are blended in a weight ratio range from about 1:15 to about 1:1.

A thirty-first embodiment may include any one of the twenty-seventh through thirtieth embodiments wherein the tungsten etch inhibitor is polylysine.

In a thirty-second embodiment a chemical mechanical polishing composition may comprise, consist of, or consist essentially of a liquid carrier and colloidal silica particles dispersed in the liquid carrier, the colloidal silica particles having a positive charge of at least 10 mV in the liquid carrier; wherein the colloidal silica particles have (i) a number average aspect ratio of greater than about 1.25 and (ii) a normalized particle size span by weight of greater than about 0.42.

A thirty-third embodiment may include the thirty-second embodiment wherein the number average aspect ratio is greater than 1.35 and the normalized particle size span by weight is greater than about 0.6.

A thirty-fourth embodiment may include any one of the thirty-second through thirty-third embodiments wherein at least 15% of the colloidal silica particles include three or more aggregated primaries.

A thirty-fifth embodiment may include any one of the thirty-second through thirty-fourth embodiments wherein: the colloidal silica particles comprise a blend of first colloidal silica particles and second colloidal silica particles; the first colloidal silica particles having a number average aspect ratio of greater than about 1.35; and the second colloidal silica particles having a number average aspect ratio of less than about 1.1.

A thirty-sixth embodiment may include the thirty-fifth embodiment wherein the first colloidal silica particles and the second colloidal silica particles are blended in a weight ratio ranging from about 1:15 to about 1:1.

In a thirty-seventh embodiment a method of chemical mechanical polishing comprises (a) contacting the substrate with a polishing composition comprising: (i) a liquid carrier; (ii) colloidal silica particles dispersed in the liquid carrier, the colloidal silica particles having a positive charge of at least 10 mV in the liquid carrier; and (iii) wherein the colloidal silica particles have (i) a number average aspect ratio of greater than about 1.25 and (ii) a normalized particle size span by weight of greater than about 0.42; (b) moving the polishing composition relative to the substrate; and (c) abrading the substrate to remove a portion of at least one layer from the substrate and thereby polish the substrate.

A thirty-eighth embodiment includes the thirty-seventh embodiment wherein: the substrate comprises a tungsten layer; the composition further comprises an iron-containing accelerator and a tungsten etch inhibitor; and a portion of the tungsten layer is removed from the substrate while abrading in (c).

A thirty-ninth embodiment includes the thirty-eighth embodiment wherein the tungsten inhibitor is polylysine.

A fortieth embodiment includes any one of the thirty-seventh through thirty-ninth embodiments wherein the number average aspect ratio is greater than 1.35 and the normalized particle size span by weight is greater than about 0.6.

A forty-first embodiment includes any one of the thirty-seventh through fortieth embodiments wherein at least 15% of the colloidal silica particles include three or more aggregated primaries.

A forty-second embodiment includes any one of the thirty-seventh through forty-first embodiments wherein the colloidal silica particles comprise a blend of first colloidal silica particles and second colloidal silica particles, the first colloidal silica particles having a number average aspect ratio of greater than about 1.35, and second colloidal silica particles having a number average aspect ratio of less than about 1.15.

The following examples further illustrate the invention but, of course, should not be construed as in any way limiting its scope.

Example 1

Twenty-three colloidal silica containing compositions were prepared and evaluated. The colloidal silica in each composition included a permanent positive charge imparted by surface treatment with an aminosilane and/or via an internal aminosilane. Compositions 1A and 1C were treated with 3-aminopropyltrimethoxysilane (APTMS). Compositions 1B, 1E, 1F, 1G, 1H, 1I, and 1J were treated as described in Example 7 of U.S. Pat. No. 9,382,450. Composition 1D was prepared as described in Example 13 of U.S. Pat. No. 9,422,456. The remaining 13 compositions included blends of the above described colloidal silica compositions. The twenty-three colloidal silica compositions are described in more detail below in Table 1A. Further analytical data is provided in Tables 1B and 1C.

TABLE 1A

| Composition | Colloidal Silica Comments |
| --- | --- |
| 1A | Spheroid/Oblong |
| 1B | Substantially Spherical |
| 1C | Spheroid/Oblong |
| 1D | Partially Aggregated |
| 1E | Partially Aggregated |
| 1F | Substantially Spherical |
| 1G | Substantially Spherical |
| 1H | Partially Aggregated |
| 1I | Spheroid/Oblong |
| 1J | Aggregated |
| 1K | 1:1 Blend of 1A and 1E |
| 1L | 1:1 Blend of 1A and 1D |
| 1M | 1:1 Blend of 1B and 1F |
| 1N | 1:1 Blend of 1B and 1G |
| 1O | 1:1 Blend of 1B and 1H |
| 1P | 1:1 Blend of 1B and 1I |
| 1Q | 1:1 Blend of 1B and 1J |
| 1R | 1:1 Blend of 1A and 1B |
| 1S | 1:1 Blend of 1B and 1C |
| 1T | 1:1 Blend of 1B and 1D |
| 1U | 1:1 Blend of 1C and 1E |
| 1V | 1:1 Blend of 1C and 1D |
| 1W | 5:1 Blend of 1B and 1D |

Samples of each of the colloidal silica compositions were prepared for TEM imaging by drop-casting 30 μL samples onto lacey carbon-coated Cu grids deployed on filters to wick away excess liquid. After drying, multiple TEM bright field images were obtained of the remaining particles (the particles that remain after wicking away of the liquid). Example TEM images are depicted in FIGS. 1A, 1B, and 1C as described above. In this example, 20 images were obtained for each sample and were stacked into a single file using FIJI open source image processing software (https://en.wikipedia.org/wiki/Fiji_(software). Each image was obtained at a magnification of 20,000 and included 2048× 2048 pixels. Using the FIJI software, the background was subtracted (using a rolling ball process) and the images were contrast enhanced to scale the intensity resolution. The pixel size was computed and input into the software (using the image scale bar). Machine learning software (using the trainable WEKA segmentation algorithm available in FIJI) was used to create binary images of the particle and background (a black particle in a white background). The machine learning software was user guided with the user defining selected particles. The WEKA software then evaluated selected images in the stack. An iterative process enabled the software to accurately find the particles. The learned algorithm was then applied to whole stack to generate binary images. A particle analyzing routine (available in FIJI) was then applied to the images in the stack to compute an aspect ratio for each identified particle in each image (the aspect ratio being defined as the maximum caliper diameter of the particle divided by the minimum caliper diameter of the particle). The median value (AR50) was computed and is recorded in Table 1B for each of the colloidal silica compositions.

The TEM images were further analyzed to evaluate a degree of aggregation for twelve of the twenty-three colloidal silica compositions. Degree of aggregation was evaluated by counting the number percentage of colloidal silica particles having three or more primary particles (trimer+) and the number percentage of primary particles having either one or two primary particles (dimer−). The results are also recorded in Table 1B.

The zeta potential the colloidal silica particles in each of the polishing compositions was measured using a Zetasizer® available from Malvern Instruments at 0.3 weight percent total silica solids and at a pH of about 2.4. These zeta-potential values are also recorded in Table 1B.

TABLE 1B

| Colloidal Silica | AR50 | Percent Trimer(+) | Percent Dimer(−) | Zeta Potential |
|---|---|---|---|---|
| 1A | 1.14 | 4.3 | 95.7 | 37.6 mV |
| 1B | 1.08 | 0.8 | 99.2 | 45.7 mV |
| 1C | 1.20 | 10.6 | 89.4 | 35.9 mV |
| 1D | 1.45 | 39 | 61 | 28.5 mV |
| 1E | 1.38 | | | |
| 1F | 1.09 | | | |
| 1G | 1.08 | | | |
| 1H | 1.21 | | | |
| 1I | 1.18 | | | |
| 1J | 1.34 | | | |
| 1K | 1.38 | | | 30.7 mV |
| 1L | 1.42 | 36.2 | 63.8 | 33.7 mV |
| 1M | 1.09 | 4.0 | 96.0 | 37.4 mV |
| 1N | 1.08 | 3.1 | 96.9 | 37.5 mV |
| 1O | 1.21 | | | 35.1 mV |
| 1P | 1.17 | | | 37.5 mV |
| 1Q | 1.29 | | | 42.3 mV |
| 1R | 1.12 | 3.1 | 96.9 | 36.0 mV |
| 1S | 1.19 | 9.9 | 90.1 | 37.6 mV |
| 1T | 1.43 | 37.4 | 62.6 | 41.9 mV |
| 1U | 1.36 | 47.7 | 52.3 | 24.3 mV |
| 1V | 1.36 | 28.8 | 71.2 | 29.7 mV |
| 1W | 1.38 | 32.2 | 67.8 | 43.2 mV |

The particle size distribution of each colloidal silica composition was obtained using a CPS Disc Centrifuge Particle size analyzer (e.g., Model DC24000HR) available from CPS Instruments, Prairieville, La. Standard instrument settings were used to obtain D10, D50, and D90 by weight (i.e., weight-based rather than number based D10, D50, and D90). The weight-based normalized span of each colloidal silica composition was computed from these values using the equation presented above. The D10, D50, and D90 values and the computed normalized span are recorded in Table 1C.

TABLE 1C

| Colloidal Silica | Normalized Span | D10 | D50 | D90 |
|---|---|---|---|---|
| 1A | 0.376 | 74.4 | 86.9 | 107.1 |
| 1B | 0.220 | 98.5 | 110.9 | 122.8 |
| 1C | 0.469 | 45.5 | 57.0 | 72.2 |
| 1D | 0.396 | 37.8 | 46.7 | 56.4 |
| 1E | 0.622 | 27 | 37 | 50 |
| 1F | 0.291 | 47 | 55 | 63 |
| 1G | 0.282 | 66 | 78 | 88 |
| 1H | 0.700 | 35 | 50 | 70 |
| 1I | 0.745 | 33 | 47 | 68 |
| 1J | 0.534 | 66 | 88 | 113 |
| 1K | 0.729 | 44.5 | 77.7 | 101.2 |
| 1L | 0.768 | 41.3 | 78.8 | 101.9 |
| 1M | 0.638 | 57.2 | 101.1 | 121.7 |
| 1N | 0.533 | 68.5 | 97.1 | 120.3 |
| 1O | 0.348 | 93.7 | 111.4 | 132.5 |
| 1P | 0.715 | 47.5 | 105.9 | 123.2 |
| 1Q | 0.507 | 68.5 | 102.2 | 120.3 |
| 1R | 0.422 | 77.8 | 101.5 | 120.7 |
| 1S | 0.680 | 51.4 | 102.4 | 121.0 |
| 1T | 0.784 | 39.5 | 102.4 | 119.8 |
| 1U | 0.444 | 45.1 | 57.2 | 70.5 |
| 1V | 0.547 | 39.9 | 51.2 | 67.9 |
| 1W | 0.771 | 42.8 | 110.1 | 127.7 |

Example 2

The tungsten (W) polishing rate was evaluated in this example for certain ones of the colloidal silica compositions described above in Example 1. Each of the polishing compositions included 0.3 weight percent colloidal silica and had a pH of about 2.5 at point of use. Each composition further included 412 ppm by weight ferric nitrate nonahydrate, 890 ppm by weight malonic acid, 15 ppm by weight of the cationic polymer polydiallyldimethylammonium chloride (polyDADMAC), 30 ppm by weight benzisothiazolinone biocide (BIT), and 5 weight percent hydrogen peroxide at point of use. The W polishing rates were obtained by polishing 200 mm blanket wafers having a W layer using a Mirra® CMP tool (available from Applied Materials) and an NexPlanar E6088 polishing pad at downforce of 2.0 psi, a platen speed of 100 rpm, a head speed of 85 rpm, and a slurry flow rate of 150 mL/min. The polishing time was sixty seconds. The measured tungsten polishing rates are listed in Table 2.

TABLE 2

| Polishing Composition | Colloidal Silica | W Polishing Rate (Å/min) |
|---|---|---|
| 2A | 1A | 2174 |
| 2B | 1B | 1720 |
| 2C | 1C | 2100 |
| 2D | 1D | 3099 |
| 2K | 1K | 2823 |
| 2L | 1L | 2806 |
| 2M | 1M | 1925 |
| 2N | 1N | 1854 |
| 2O | 1O | 2495 |
| 2P | 1P | 2266 |
| 2Q | 1Q | 2719 |
| 2R | 1R | 1926 |
| 2S | 1S | 2386 |
| 2T | 1T | 2855 |
| 2U | 1U | 3015 |
| 2V | 1V | 2969 |

As is apparent from the results set forth in Table 2, high tungsten removal rates may be achieved for compositions having a number average aspect ratio of greater than about 1.25 and a normalized particle size span by weight of greater than about 0.40.

Example 3

Tungsten polishing rate, array erosion, and line recessing (dishing) were evaluated in this example for six polishing compositions. This example demonstrates the synergistic combination of the inventive colloidal silica and a polylysine tungsten etch inhibitor to achieve both high tungsten polishing rates and very low array erosion and line recessing. Each polishing composition included malonic acid (3A 445 ppm by weight and 3B-3F 890 ppm by weight), ferric nitrate nonahydrate (3A 206 ppm by weight and 3B-3F 412 ppm by weight), polylysine (3A-3C, 3E, 3F 10 ppm by weight and 3D 16 ppm by weight), benzisothiazolinone biocide (3A-3C 10 ppm and 3D-3F 30 ppm), and 5 weight percent hydrogen peroxide. The point of use pH values were 2.5. Further detail regarding the colloidal silica compositions is in Table 3A.

Tungsten polishing rates were obtained by polishing 300 mm blanket tungsten wafers while the array erosion and line dishing values were obtained by polishing 300 mm 2kÅ Silyb 754 tungsten patterned wafers (available from Silyb Wafer Services). The wafers were polished using a Reflexion® CMP polishing tool (Applied Materials) and an IC1010 polishing pad (Rohm and Haas/Dow Chemical) at a downforce of 2.0 psi, a platen speed of 100 rpm, and a head speed of 101 rpm. The slurry flow rate was 250 mL/min. Each patterned wafer was polished to optical End-Point plus an additional overpolish. The amount of overpolish is given in Table 3B. The array erosion and line recessing values were obtained using atomic force microscope (AFM) profilometer measurements across a 1 x1 and 3×1 micron line features. The tungsten polishing rates are shown in Table 3A and array erosion and line dishing values are shown in Table 3B.

TABLE 3A

| Polishing Composition | Colloidal Silica (weight percent) | | W Polishing Rate Å/min |
|---|---|---|---|
| 3A | 0.3 1B | | 3006 |
| 3B | 0.5 1B | 0.1 1C | 4184 |
| 3C | 0.5 1B | 0.1 1A | 3173 |
| 3D | 0.4 1B | 0.4 1D | 5089 |
| 3E | 1.0 1D | | 5119 |
| 3F | 0.6 1D | | 3427 |

TABLE 3B

| Polishing Composition | Array Erosion (1 × 1 µm) | Line Recessing (1 × 1 µm) | Array Erosion (3 × 1 µm) | Line Recessing (3 × 1 µm) | Over polish (%) |
|---|---|---|---|---|---|
| 3A | 102 | 17 | 13 | −5 | 15 |
| 3B | 101 | 116 | 235 | 128 | 15 |
| 3C | 16 | 36 | 169 | 43 | 15 |
| 3D | 89 | 3 | 206 | 4 | 30 |
| 3E | 391 | 129 | 673 | 145 | 30 |
| 3F | 100 | 125 | 228 | 157 | 10 |

As is evident from the data set forth in Tables 3A and 3B, only composition 3D in which the colloidal silica particles have a number average aspect ratio of greater than about 1.25 and a normalized particle size span by weight of greater than about 0.40 is able to achieve both a high polishing rate (e.g., over 5000 Å/min) and a highly planar surface (e.g., array erosion and line recessing both less than 100 Å for 1×1 micron feature). Furthermore composition 3D was found to achieve the excellent planarity even at 30 percent overpolish.

It will be understood that the recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition comprising:
   a liquid carrier;
   colloidal silica particles dispersed in the liquid carrier, the colloidal silica particles having a positive charge of at least 10 mV in the liquid carrier;
   an iron-containing accelerator;
   a metal etch inhibitor; and
   wherein the colloidal silica particles have (i) a number average aspect ratio of greater than about 1.25 and (ii) a normalized particle size span by weight of greater than about 0.42.

2. The composition of claim 1, wherein the colloidal silica particles have a number average aspect ratio of greater than about 1.35.

3. The composition of claim 1, wherein the colloidal silica particles have a normalized particle size span by weight of greater than about 0.6.

4. The composition of claim 1, wherein the colloidal silica particles have (i) a number average aspect ratio of greater than about 1.35 and a normalized particle size span by weight of greater than about 0.6.

5. The composition of claim 1, wherein the colloidal silica particles have a particle size distribution by number in which D50 is in a range from about 20 nm to about 60 nm.

6. The composition of claim 1, wherein the colloidal silica particles have a particle size distribution by weight in which D50 is in a range from about 60 nm to about 140 nm.

7. The composition of claim 1, wherein:
   the colloidal silica particles comprise a blend of first colloidal silica particles and second colloidal silica particles;
   the first colloidal silica particles having a number average aspect ratio of greater than about 1.35; and
   the second colloidal silica particles having a number average aspect ratio of less than about 1.15.

8. The composition of claim 7, wherein the first colloidal silica particles and the second colloidal silica particles are blended in a weight ratio ranging from about 1:15 to about 1:1.

9. The composition of claim 7, wherein:
   the first colloidal silica particles have a normalized particle size span by weight of less than about 0.42; and
   the second colloidal silica particles have a normalized particle size span by weight of less than about 0.42.

10. The composition of claim 1, wherein the colloidal silica particles have a permanent positive charge of at least 10 mV.

11. The composition of claim 1, wherein the iron-containing accelerator comprises a soluble iron-containing catalyst and the composition further comprises a stabilizer bound to the soluble iron-containing catalyst, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

12. The composition of claim 1, further comprising a hydrogen peroxide oxidizer.

13. The composition of claim 1, having a pH in a range from about 1.0 to about 5.0.

14. The composition of claim 1, wherein the metal etch inhibitor is polylysine.

15. A chemical mechanical polishing composition comprising:
   a liquid carrier;
   colloidal silica particles dispersed in the liquid carrier, the colloidal silica particles having a positive charge of at least 10 mV in the liquid carrier;
   an iron-containing accelerator;
   a metal etch inhibitor;
   wherein the colloidal silica particles have a normalized particle size span of greater than about 0.42; and
   wherein at least 15% of the colloidal silica particles include three or more aggregated primaries.

16. The composition of claim 15, wherein the colloidal silica particles have a normalized particle size span of greater than about 0.6.

17. The composition of claim 15, wherein less than 50% of the colloidal silica particles are monomers.

18. The composition of claim 15, wherein:
   the colloidal silica particles have a normalized particle size span of greater than about 0.6; and
   less than 50% of the colloidal silica particles are monomers.

19. The composition of claim 15, wherein the colloidal silica particles have a number average aspect ratio of greater than about 1.25.

20. The composition of claim 15, further comprising a hydrogen peroxide oxidizer.

21. The composition of claim 15, having a pH in a range from about 1.0 to about 5.0.

22. The composition of claim 15, wherein the metal etch inhibitor is polylysine.

23. A chemical mechanical polishing composition comprising:
   a liquid carrier;
   colloidal silica particles dispersed in the liquid carrier, the colloidal silica particles having a positive charge of at least 10 mV in the liquid carrier; and
   wherein the colloidal silica particles have (i) a number average aspect ratio of greater than about 1.25 and (ii) a normalized particle size span by weight of greater than about 0.42.

24. The composition of claim 23, wherein the number average aspect ratio is greater than 1.35 and the normalized particle size span by weight is greater than about 0.6.

25. The composition of claim 23, wherein at least 15% of the colloidal silica particles include three or more aggregated primaries.

26. The composition of claim 23, wherein:
   the colloidal silica particles comprise a blend of first colloidal silica particles and second colloidal silica particles;
   the first colloidal silica particles having a number average aspect ratio of greater than about 1.35; and
   the second colloidal silica particles having a number average aspect ratio of less than about 1.1.

27. The composition of claim 26, wherein the first colloidal silica particles and the second colloidal silica particles are blended in a weight ratio ranging from about 1:15 to about 1:1.

28. A method of chemical mechanical polishing a substrate, the method comprising:
   (a) contacting the substrate with a polishing composition comprising:
      (i) a liquid carrier;
      (ii) colloidal silica particles dispersed in the liquid carrier, the colloidal silica particles having a positive charge of at least 10 mV in the liquid carrier; and
      (iii) wherein the colloidal silica particles have (i) a number average aspect ratio of greater than about 1.25 and (ii) a normalized particle size span by weight of greater than about 0.42;
   (b) moving the polishing composition relative to the substrate; and
   (c) abrading the substrate to remove a portion of at least one layer from the substrate and thereby polish the substrate.

29. The method of claim 28, wherein:
   the substrate comprises a tungsten layer;
   the composition further comprises an iron-containing accelerator and a tungsten etch inhibitor; and
   a portion of the tungsten layer is removed from the substrate while abrading in (c).

30. The method of claim 29, wherein the tungsten inhibitor is polylysine.

31. The method of claim 28, wherein the number average aspect ratio is greater than 1.35 and the normalized particle size span by weight is greater than about 0.6.

32. The method of claim 28, wherein at least 15% of the colloidal silica particles include three or more aggregated primaries.

* * * * *